United States Patent
Wright

(10) Patent No.: US 8,949,478 B2
(45) Date of Patent: Feb. 3, 2015

(54) INTELLIGENT SERIAL INTERFACE

(71) Applicant: Cypress Semiconductor Corporation, San Jose, CA (US)

(72) Inventor: David G. Wright, Woodinville, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/680,539

(22) Filed: Nov. 19, 2012

(65) Prior Publication Data
US 2013/0205054 A1 Aug. 8, 2013

Related U.S. Application Data

(63) Continuation of application No. 12/005,774, filed on Dec. 28, 2007, now abandoned.

(60) Provisional application No. 60/906,605, filed on Mar. 12, 2007.

(51) Int. Cl.
*G06F 13/42* (2006.01)
*G06F 13/00* (2006.01)
(Continued)

(52) U.S. Cl.
CPC . *H02M 1/08* (2013.01); *G06F 1/24* (2013.01); *G06F 13/409* (2013.01); *H03L 5/00* (2013.01);
(Continued)

(58) Field of Classification Search
CPC ........... G06F 3/00; G06F 13/00; G06F 13/36; G06F 13/38; G06F 13/385; G06F 13/40; G06F 13/42; G11C 7/00; G11C 7/10; G11C 7/1078; G11C 7/22

USPC ............ 710/8, 11, 14–16, 18, 62–64, 72–74, 710/100, 105, 300, 315
See application file for complete search history.

(56) References Cited

U.S. PATENT DOCUMENTS 5,878,234 A 3/1999 Dutkiewicz et al.
6,038,400 A * 3/2000 Bell et al. ........................ 710/11
(Continued)

FOREIGN PATENT DOCUMENTS

EP 0619548 A 10/1994

OTHER PUBLICATIONS

USPTO Advisory Action for U.S. Appl. No. 12/005,774 dated Mar. 12, 2012; 3 pages.
(Continued)

*Primary Examiner* — Tanh Nguyen

(57) ABSTRACT

An intelligent serial interface circuit in accordance with one embodiment of the invention can include a first communication interface circuit for enabling a first communication protocol. The intelligent serial interface circuit can also include a second communication interface circuit for enabling a second communication protocol. Furthermore, the intelligent serial interface circuit can include a detector circuit coupled to the first communication interface circuit and the second communication interface circuit. The detector circuit can be for automatically detecting a factor that indicates automatically enabling the first communication interface circuit and automatically disabling the second communication interface circuit. The detector circuit can be for detecting a coupling of a pin of the first communication interface circuit that is not used by the second communication interface circuit.

4 Claims, 6 Drawing Sheets

(51) Int. Cl.
  *G06F 13/12* (2006.01)
  *G06F 13/38* (2006.01)
  *H02M 1/08* (2006.01)
  *G06F 1/24* (2006.01)
  *G06F 13/40* (2006.01)
  *H03L 5/00* (2006.01)
  *H04L 9/06* (2006.01)
  *H04L 9/08* (2006.01)
  *H04L 29/06* (2006.01)

(52) U.S. Cl.
  CPC ............... *H04L 9/06* (2013.01); *H04L 9/0631* (2013.01); *H04L 9/0816* (2013.01); *H04L 9/0825* (2013.01); *H04L 9/08* (2013.01); *H04L 63/0428* (2013.01); *H04L 63/0442* (2013.01); *H01L 2924/0002* (2013.01)
  USPC ........ 710/11; 710/8; 710/14; 710/15; 710/16; 710/18; 710/62; 710/63; 710/64; 710/72; 710/73; 710/74; 710/100; 710/105; 710/300; 710/315

(56) References Cited

U.S. PATENT DOCUMENTS

| | | | |
|---|---|---|---|
| 6,253,268 B1 | 6/2001 | Bjoerkengren et al. | |
| 6,487,700 B1 * | 11/2002 | Fukushima | 716/106 |
| 6,912,606 B2 | 6/2005 | Fay | |
| 7,304,923 B2 | 12/2007 | Sano et al. | |
| 7,508,242 B2 | 3/2009 | Tokuno | |
| 2002/0108011 A1 * | 8/2002 | Tanha | 710/306 |
| 2006/0117230 A1 | 6/2006 | Scipioni et al. | |

OTHER PUBLICATIONS

USPTO Final Rejection for U.S. Appl. No. 12/005,774 dated Jan. 6, 2012; 14 pages.

USPTO Final Rejection for U.S. Appl. No. 12/005,774 dated Feb. 8, 2011; 12 pages.

USPTO Final Rejection for U.S. Appl. No. 12/005,774 dated Mar. 23, 2010; 14 pages.

USPTO Final Rejection for U.S. Appl. No. 12/005,774 dated Jul. 19, 2012; 15 pages.

USPTO Non-Final Rejection for U.S. Appl. No. 12/005,774 dated May 4, 2012; 11 pages.

USPTO Non-Final Rejection for U.S. Appl. No. 12/005,774 dated Aug. 16, 2011; 15 pages.

USPTO Non-Final Rejection for U.S. Appl. No. 12/005,774 dated Sep. 15, 2009; 12 pages.

USPTO Non-Final Rejection for U.S. Appl. No. 12/005,774 dated Oct. 27, 2010; 14 pages.

* cited by examiner

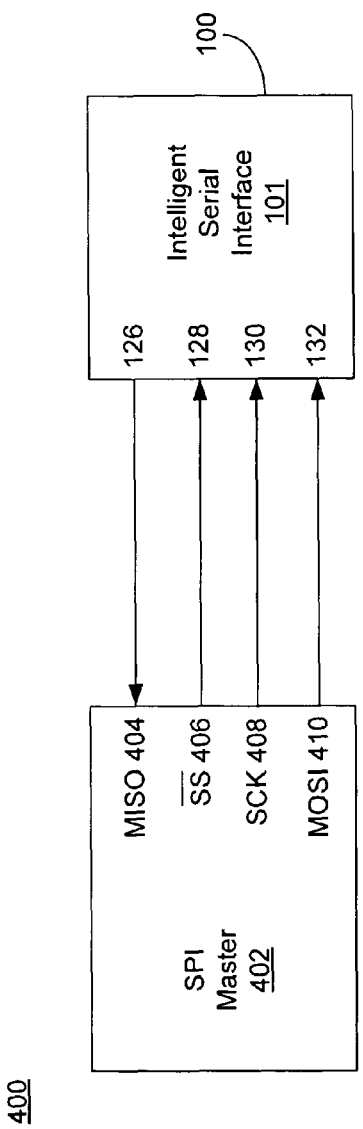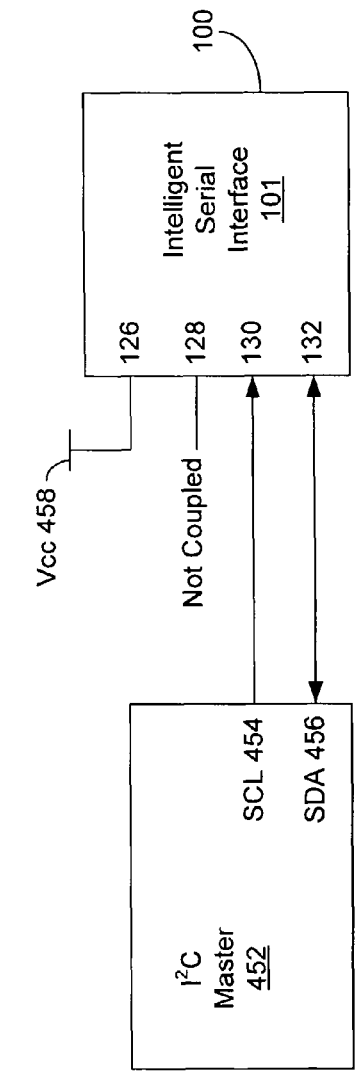

INTELLIGENT SERIAL INTERFACE

RELATED U.S. APPLICATIONS

This application is a continuation of and claims priority to U.S. application Ser. No. 12/005,774, filed Dec. 28, 2007, which claims priority to U.S. Provisional Patent Application Number 60/906,605, filed Mar. 12, 2007. U.S. application Ser. No. 12/005,774, filed Dec. 28, 2007, is incorporated by reference herein.

BACKGROUND

Currently in the market there exist manufacturers of serial memory devices that include a communication bus interface. For example, a manufacturer may incorporate a serial memory device with either an Inter-Integrated Circuit ($I^2C$) communication bus interface or a Serial Peripheral Interface (SPI) bus, wherein each interface has a different pin count. Given this situation, conventionally suppliers of serial memories maintain and sell a different serial memory for each interface. For instance, the conventionally suppliers of serial memories can have one part number for an $I^2C$ interface serial memory and another part number for a Serial Peripheral Interface memory. Unfortunately, this leads to inventory issues as many different serial memories are maintained, supported, and the like.

One conventional solution for the above problem is to manufacture a single chip that includes, for example, both a Serial Peripheral Interface and an $I^2C$ interface and on the die itself are included six pads (two pads for the $I^2C$ interface and four pads for the Serial Peripheral Interface) to compensate for the difference in pin counts of the different interfaces. As such, if a manufacturer is going sell the single chip as an $I^2C$ interface serial memory, the manufacturer can bond out the two unique $I^2C$ pads to two pins on the package so that it can be used for $I^2C$. Alternatively, if the manufacturer is going sell the single chip as a Serial Peripheral Interface serial memory, the manufacturer can bond out the four unique SPI pads to four pins on the package so that is can be used for SPI. However, one of the disadvantageous of including additional pads on the die to support the different memory interfaces is that it increases the manufacturing cost of the memory chip.

As such, it is desirable to address one or more of the above issues.

SUMMARY

An intelligent serial interface circuit in accordance with one embodiment of the invention can include a first communication interface circuit for enabling a first communication protocol. The intelligent serial interface circuit can also include a second communication interface circuit for enabling a second communication protocol. Furthermore, the intelligent serial interface circuit can include a detector circuit coupled to the first communication interface circuit and the second communication interface circuit. The detector circuit can be for automatically detecting a factor that indicates automatically enabling the first communication interface circuit and automatically disabling the second communication interface circuit. The detector circuit can be for detecting a coupling of a pin of the first communication interface circuit that is not used by the second communication interface circuit.

BRIEF DESCRIPTION OF THE DRAWINGS

FIG. 4A is a block diagram of an exemplary system in accordance with various embodiment of the invention.

FIG. 4B is a block diagram of another exemplary system in accordance with various embodiment of the invention.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Unless specifically stated otherwise as apparent from the following discussions, it is appreciated that throughout the present detailed description, discussions utilizing terms such as "detecting", "generating", "determining", "transmitting", "disabling", "performing", "enabling", "programming", "utilizing", "incorporating", "producing", "retrieving", "outputting", or the like, can refer to the actions and processes of a computer system or electronic computing device, but is not limited to such. The computer system or electronic computing device can manipulate and transform data represented as physical (electronic) quantities within the computer system's registers and/or memories into other data similarly represented as physical quantities within the computer system memories and/or registers or other such information storage, transmission, or display devices. Some embodiments of the invention are also well suited to the use of other computer systems such as, for example, optical and virtual computers.

Figure 1:
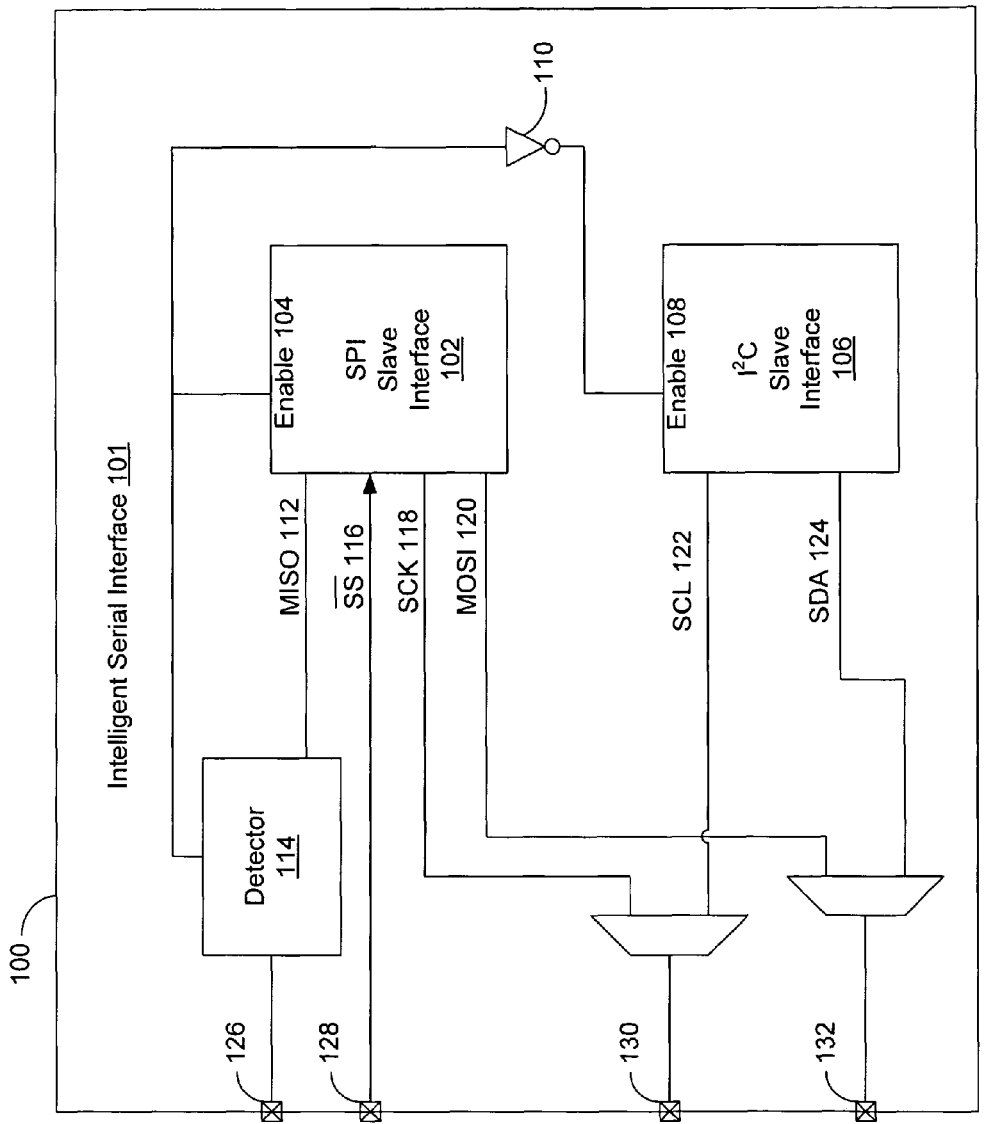
FIG. 1 is schematic diagram of an exemplary intelligent serial interface circuit in accordance with various embodiments of the invention.

FIG. 1 is schematic diagram of an exemplary intelligent serial interface circuit 101 in accordance with various embodiments of the invention. Note that the intelligent serial interface circuit 101 can be implemented as part of an integrated circuit 100. The intelligent serial interface circuit 101 can include multiple serial communication bus interfaces, can automatically detect which one is being used within a circuitry or host system (e.g., memory, EEPROM, and the like), and then enable the supported protocol for communication. The intelligent serial interface circuit 101 can include, but is not limited to, a detector circuit 114, a Serial Peripheral Interface (SPI) bus slave interface circuit 102, an Inter-Integrated Circuit ($I^2C$) communication bus slave interface circuit 106, and an inverter circuit 110.

Specifically, the intelligent serial interface circuit 101 can include, but is not limited to, an I²C communication bus slave interface circuit 106 and also a SPI bus slave interface circuit 102, each for implementing their own protocol separately. It is noted that the I²C slave interface circuit 106 and the SPI slave interface circuit 102 have a different number of input and output couplings (or pin counts). As such, in an embodiment, the intelligent serial interface circuit 101 can utilizes that difference to automatically detect which communication bus interface circuit is being used within a host system and then enable that protocol for bus communication. For example, the SPI slave interface circuit 102 includes an output for transmitting a Master Input/Slave Output (MISO) signal 112 and an input for receiving a Slave Select signal (SS-bar) 116, both of which the I²C slave interface circuit 106 does not include. As such, in one embodiment, the detector circuit 114 can be coupled to the SPI slave interface circuit 102 in order to receive the MISO signal 112. Also, the detector circuit 114 can be coupled to output the MISO signal 112 to the MISO pin 126 of the integrated circuit 100. The detector circuit 114 can compare the load on the MISO pin 126 with the received MISO signal 112 in order to detect whether or not the intelligent serial interface 101 is configured or coupled for SPI operation or I²C operation.

Within FIG. 1, in an embodiment, it is pointed out that if the I²C slave interface circuit 106 of the intelligent serial interface 101 is to be utilized and active within a host system, the MISO pin 126 and the SS pin 128 of the integrated circuit 100 will not be used and can thus be coupled to power or ground within the host system. Alternatively, if the SPI slave interface circuit 102 of the intelligent serial interface 101 is to be utilized and active within a host system, the MISO pin 126 and the SS pin 128 of the integrated circuit 100 can be coupled over a SPI bus to other components (e.g., a SPI Master) on the SPI bus. As such, if data contention is observed by the detector circuit 114 between the received MISO signal 112 and the voltage of the MISO pin 126, then the detector circuit 114 can enable the SPI slave interface 102 and disable the I²C slave interface 106. Specifically, in an embodiment, the detector circuit 114 can output a logic 1 signal to the enable input 104 of the SPI slave interface 102, thereby enabling the SPI slave interface 102. Additionally, the logic 1 signal output by the detector circuit 114 can be received by the inverter circuit 110. The inverter circuit 110 can convert the received logic 1 signal into a logic zero signal, which the inverter 110 can output to the enable input 108 of the I²C slave interface 106, thereby disabling the I²C slave interface 106. Note that the detector circuit 114 can detect contention between the MISO signal 112 and any other signal that would be on the SPI bus via the MISO pin 126.

In an embodiment, the I²C slave interface circuit 106 can be coupled to a clock pin 130 of the integrated circuit 100 to receive an I²C Serial Clock (SCL) signal 122 from an I²C master device while the SPI slave interface circuit 102 can also be coupled to the clock pin 130 to receive a SPI Serial Clock (SCK) signal 118 from a SPI master device. Also, in one embodiment, the I²C slave interface circuit 106 can be coupled to a data pin 132 of the integrated circuit 100 to receive an I²C Serial Data (SDA) signal 124 from an I²C master device while the SPI slave interface circuit 102 can also be coupled to the data pin 132 to receive a Master Output/Slave Input (MOSI) signal 120 from a SPI master device. The SPI slave interface 102 can be coupled to a Slave Select pin 128 of the integrated circuit 100 to receive the SS-bar signal 116 from a SPI master device.

It is pointed out that one of the advantages of the intelligent serial interface 101 is that it can be cost effective to implement and it uses just 4 pins, but is not limited to such. In one embodiment, it is noted that the intelligent serial interface 101 can enable a semiconductor supplier to sell a single part that can include multiple different communication interfaces having an automatic detection functionality. Furthermore, the intelligent serial interface 101 can enable a customer to buy a single device that can be automatically be utilized with multiple different communication interfaces. Moreover, the intelligent serial interface 101 can enable an end product manufacturer to have one part on inventory that can cover multiple different communication interfaces, which can reduce the amount of inventory and can reduce the risk of not being able to get supply.

Within FIG. 1, a first terminal of the detector 114 can be coupled to the MISO pin 126 of the integrated circuit 100 while a second terminal of the detector 114 can be coupled to the enable input 104 of the SPI slave interface 102 and to an input terminal of the inverter 110. Note that a portion of a SPI bus can be coupled to the MISO pin 126 of the integrated circuit 100, but is not shown. A third terminal of the detector 114 can be coupled to receive the MISO 112 from a second terminal of the SPI slave interface 102. A third terminal of the SPI slave interface 102 can be coupled to the Slave Select pin 128 of the integrated circuit 100 in order to receive the SS-bar signal 116. A portion of a SPI bus can be coupled to the Slave Select pin 128, but is not shown. Furthermore, a fourth of the SPI interface 102 can be coupled to the clock pin 130 for receiving the SCK signal 118 while a fifth terminal of the SPI interface 102 can be coupled to the data pin 132 for exchanging MOSI 120. It is noted that a portion of a SPI bus can be coupled to each of the clock pin 130 and the data pin 132 of the integrated circuit 100. The enable input 108 of the I²C interface 106 can be coupled to an output terminal of the inverter 110. A second interface of the I²C interface 106 can be coupled to the clock pin 130 of the integrated circuit 100 for exchanging the SCL 122. Additionally, a third interface of the I²C interface 106 can be coupled to the data pin 132 of the integrated circuit 100 for exchanging SDA 124.

Within FIG. 1, it is understood that the intelligent serial interface 101 may not include all of the elements illustrated by FIG. 1. Additionally, the intelligent serial interface 101 can be implemented to include one or more elements not illustrated by FIG. 1.

Figure 2:
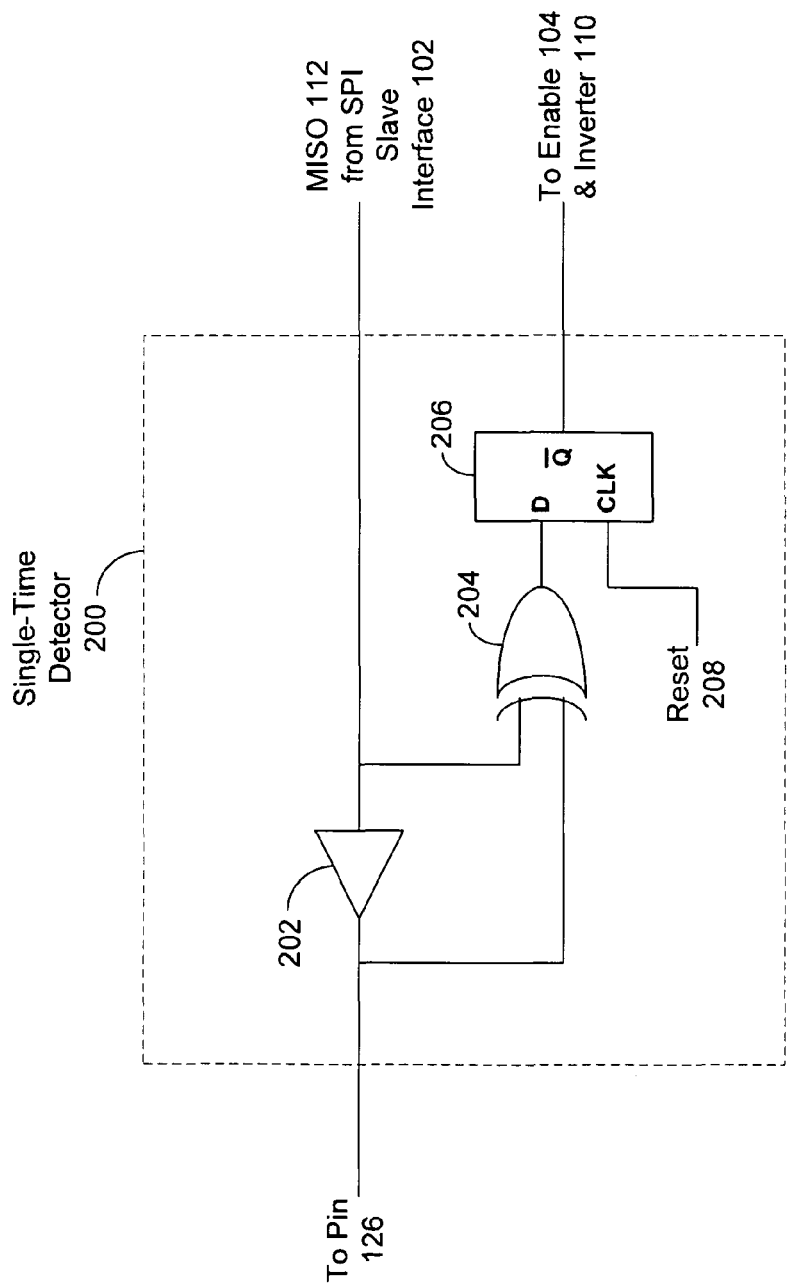
FIG. 2 is schematic diagram of an exemplary single-time detector circuit in accordance with various embodiments of the invention.

FIG. 2 is schematic diagram of an exemplary single-time detector circuit 200 in accordance with various embodiments of the invention. It is pointed out that most digital devices have some kind of power-on reset circuitry, such as, an external reset interrupt with input or some internal voltage supervisory function. As such, when a reset signal 208 is produced in association with that digital device and it comes out of reset, the single-time detector circuit 200 can be coupled to receive the reset signal 208. The reset signal 208 can cause the detector circuit 200 to automatically make a single-time (or one-time) determination as to which communication bus interface (e.g., 102 or 106) is being used by the digital device or circuitry or host system (e.g., memory). In an embodiment, the single-time detector circuit 200 is just active upon a power-on reset, but is not limited to such. It is pointed out that the elements of FIG. 2 having the same reference numbers as the elements of any other figure can operate or function in any manner similar to that described herein, but are not limited to such. In an embodiment, the single-time detector circuit 200 can be an implementation of the detector circuit 114 of FIG. 1.

Specifically, an input/output (I/O) driver circuit 202 and an exclusive OR (XOR) logic gate 204 of the single-time detector circuit 200 can be coupled to the SPI slave interface 102 in order to receive the MISO signal 112 output by it. In an embodiment, in the default state of the intelligent serial interface 101, the SPI slave interface 102 can be enabled and it can drive or output the MISO signal 112. As such, the single-time detector 200 can perform a comparison between the received MISO signal 112 and the actual voltage on the MISO pin 126. Specifically, the XOR gate 204 can compare the received MISO signal 112 and the actual voltage on the MISO pin 126. If they are different, that can mean that the SPI slave interface 102 is trying to drive the MISO pin 126 in one voltage direction with the MISO signal 112 but the voltage on the MISO pin 126 will not change, which can mean that the MISO pin 126 has been coupled to power or ground since it is not in use. As such, in an embodiment, the single-time detector circuit 200 can disable the SPI slave interface 102 and enable the I²C slave interface 106. However, if the XOR gate 204 compares the received MISO signal 112 and the actual voltage on the MISO pin 126 and they are substantially the same, that can mean that the MISO pin 126 has been coupled to be used with the SPI slave interface 102. As such, in an embodiment, the single-time detector circuit 200 can keep the SPI slave interface 102 enabled while it can disable the I²C slave interface 106.

More specifically within FIG. 2, if the received MISO signal 112 and the actual voltage on the MISO pin 126 are substantially the same, the XOR gate 204 can output a logic 0 signal, which can be received by the D input of the D flip-flop 206. On receipt of the reset signal 208 at the clock (CLK) input of the D flip-flop 206, the Q-bar output of the D flip-flop 206 can output a logic 1 signal, which can be sent to the inverter 110 and the enable input 104 of the SPI slave interface 102. As such, the SPI slave interface 102 can be enabled while the I²C slave interface 106 can be disabled. However, if the received MISO signal 112 and the actual voltage on the MISO pin 126 are different, it can mean that the MISO pin 126 has been coupled to power or ground since it is not being used. As such, the XOR gate 204 can output a logic 1 signal, which can be received by the D input of the D flip-flop 206. On receipt of the reset signal 208 at the CLK input of the D flip-flop 206, the Q-bar output of the D flip-flop 206 can output a logic zero signal, which can be sent to the inverter 110 and the enable input 104 of the SPI slave interface 102. Therefore, the SPI slave interface 102 can be disabled while the I²C slave interface 106 can be enabled. It is pointed out that using the reset signal 208 into the CLK input of the D flip-flop 206 can result in the detector circuit 200 making a one time determination at the release of reset signal 208.

It is pointed out that the I/O driver (or line driver) circuit 202 can be implemented in a wide variety of ways. For example, in an embodiment in accordance with the invention, the I/O driver circuit 202 can be implemented as a fairly weak driver circuit capable of driving single digit milliamperes either high or low, but is not limited to such. In accordance with this embodiment, it is pointed out that if the I/O driver circuit 202 was coupled externally to power or ground, there would be some current flow, but it would just be a few milliamperes.

Within FIG. 2, the D input of the D flip-flop 206 can be coupled to the output of the XOR gate 204 while the clock input of the D flip-flop 206 can be coupled to receive the reset signal 208. Additionally, the Q output of the D flip-flop 206 can be coupled to an input terminal of the inverter 110 and also to the enable input 104 of the SPI slave interface 102. An input terminal of the I/O driver 202 can be coupled to receive the MISO signal 112 output from the SPI slave interface 102. An output terminal of the I/O driver 202 can be coupled to the MISO pin 126 of the integrated circuit 100. Furthermore, the output terminal of the I/O driver 202 can be coupled to a first input terminal of the XOR gate 204 while a second input terminal of the XOR gate 204 can be coupled to receive the MISO signal 112 output from the SPI slave interface 102.

Within FIG. 2, it is understood that the "single-time" (or "one-time") detector 200 may not include all of the elements illustrated by FIG. 2. Additionally, the "single-time" detector 200 can be implemented to include one or more elements not illustrated by FIG. 2.

Figure 2A:
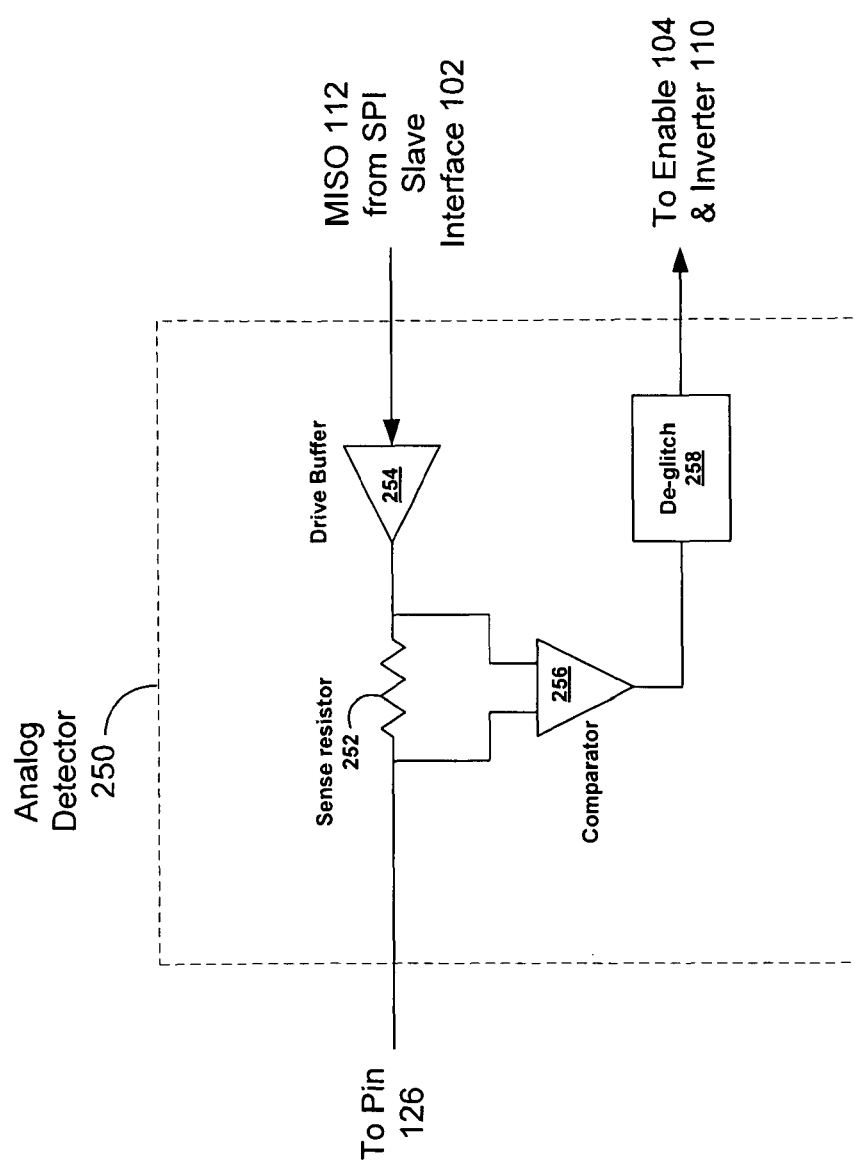
FIG. 2A is schematic diagram of an exemplary analog detector circuit in accordance with various embodiments of the invention.

FIG. 2A is schematic diagram of an exemplary analog detector circuit 250 in accordance with various embodiments of the invention. It is pointed out that the elements of FIG. 2A having the same reference numbers as the elements of any other figure herein can operate or function in any manner similar to that described herein, but are not limited to such. The analog detector circuit 250 can include, but is not limited to, a sense resistor 252, a drive buffer 254, a comparator 256, and a de-glitch circuit (or glitch filter or low pass filter) 258. Specifically, an input of the drive buffer 254 can be coupled to receive the MISO signal 112 from the SPI slave interface 102 while an output of the drive buffer 254 can be coupled to a first terminal of the sense resistor 252 and a first input of the comparator 256. A second terminal of the sense resistor 252 can be coupled to a second input of the comparator 256 and to the pin 126. An output of the comparator 256 can be coupled to an input of the de-glitch module 258 while an output of the de-glitch module 258 can be coupled to the enable 104 and the inverter 110.

During operation of the analog detector circuit 250, the comparator 256 can measure if a current across the sense resistor 252 exceeds a predefined amount or value. If the comparator 256 determines that the steady state current across the sense resistor 252 exceeds the predefined amount (e.g., 10 mA), the comparator can detect this current condition and can infer that the pin 126 was coupled to either a logic 1 or zero. As such, the comparator can output a signal to the de-glitch module 258. It is pointed out that the de-glitch module 258 can reject current spikes detected by the comparator 256 when the pin 126 switches in normal operation. Therefore, the de-glitch module 258 can output a signal corresponding to the comparator 256 detecting a predefined steady state current condition.

Within FIG. 2A, note that the sense resistor 252 can be implemented in a wide variety of ways. For example in one embodiment, the sense resistor 252 can be implemented with a resistance of 10 ohms, but is not limited to such. Additionally, the drive buffer 254 can be implemented in a variety of ways. For example in one embodiment, the drive buffer 254 can be implemented in a manner similar to the driver circuit 202 described herein, but is not limited to such.

Within FIG. 2A, it is understood that the analog detector 250 may not include all of the elements illustrated by FIG. 2A. Additionally, the analog detector 250 can be implemented to include one or more elements not illustrated by FIG. 2A.

Figure 3:
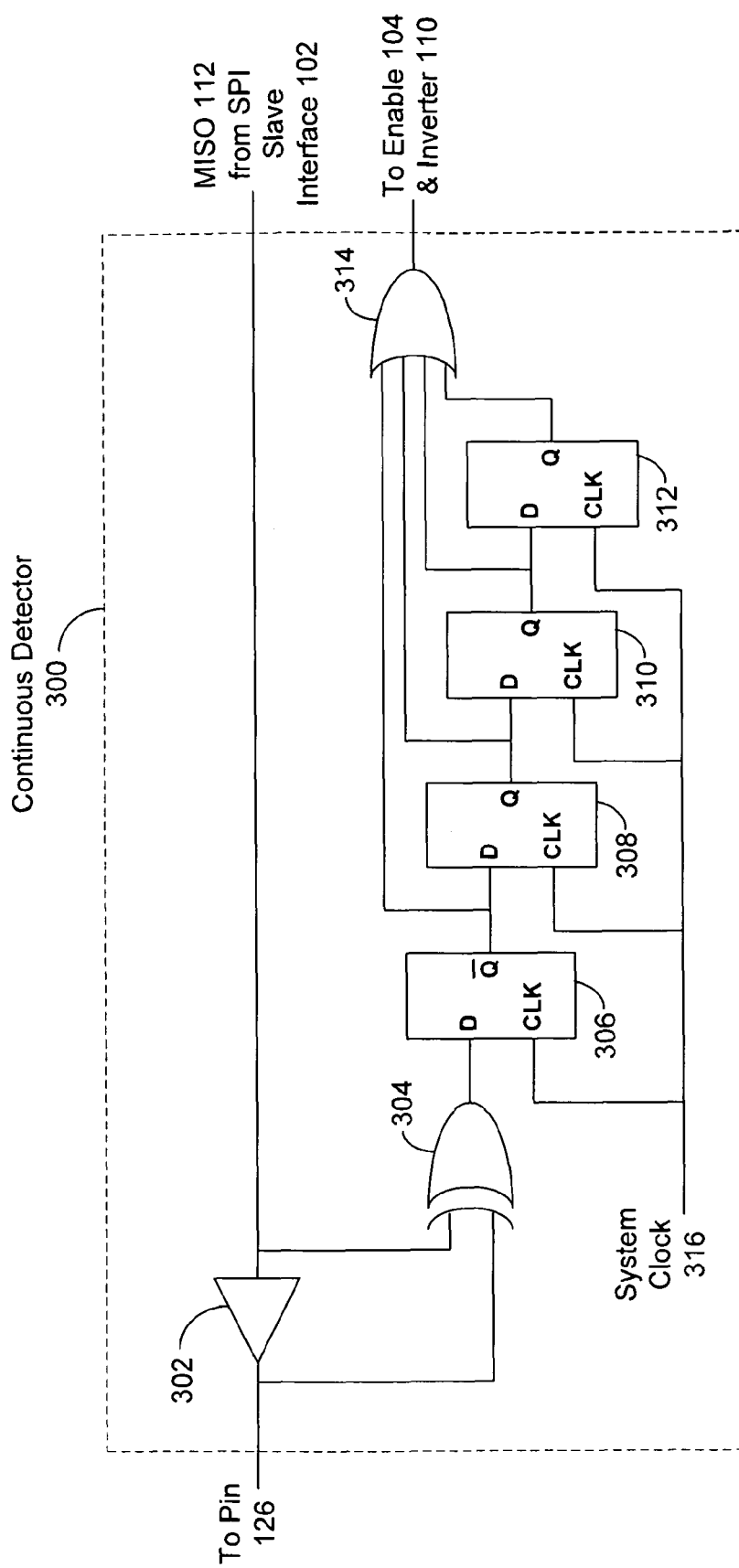
FIG. 3 is schematic diagram of an exemplary continuous detector circuit in accordance with various embodiments of the invention.

FIG. 3 is schematic diagram of an exemplary continuous detector circuit 300 in accordance with various embodiments of the invention. It is pointed out that the elements of FIG. 3 having the same reference numbers as the elements of any other figure herein can operate or function in any manner similar to that described herein, but are not limited to such. Specifically, the continuous detector circuit 300 can operate in a continuous manner and also includes a debounce functionality. The continuous detector circuit 300 can be coupled to receive a running clock signal 316, which can cause the continuous detector circuit 300 to automatically determine in a periodic manner which communication bus interface (e.g., 102 or 106) is being used by the digital device or circuitry or host system (e.g., memory). It is pointed out that the elements of FIG. 3 having the same reference numbers as the elements of any other figure can operate or function in any manner similar to that described herein, but are not limited to such. In an embodiment, the continuous detector circuit 300 can be an implementation of the detector circuit 114 of FIG. 1.

Specifically, an input/output (I/O) driver circuit 302 and an exclusive OR (XOR) logic gate 304 of the continuous detector circuit 300 can be coupled to the SPI slave interface 102 in order to receive the MISO signal 112 output by it. In an embodiment, in the default state of the intelligent serial interface 101, the SPI slave interface 102 can be enabled and it can drive or output the MISO signal 112. As such, the continuous detector 300 can perform a comparison between the received MISO signal 112 and the actual voltage on the MISO pin 126. Specifically, the XOR gate 304 of the detector circuit 300 can compare the received MISO signal 112 and the actual voltage on the MISO pin 126. If they are different, that can mean that the SPI slave interface 102 is trying to drive the MISO pin 126 in one voltage direction with the MISO signal 112 but the voltage on the MISO pin 126 will not change, which can mean that the MISO pin 126 has been coupled to power or ground since it is not in use. As such, in an embodiment, the continuous detector circuit 300 can disable the SPI slave interface 102 and enable the I²C slave interface 106. However, if the XOR gate 304 compares the received MISO signal 112 and the actual voltage on the MISO pin 126 and they are substantially the same, that can mean that the MISO pin 126 has been coupled to be used with the SPI slave interface 102. As such, in an embodiment, the continuous detector circuit 300 can keep the SPI slave interface 102 enabled while disabling the I²C slave interface 106.

Within FIG. 3, if the received MISO signal 112 and the actual voltage on the MISO pin 126 are substantially the same, the XOR gate 304 can output a logic zero signal, which can be received by the D input of the D flip-flop 306. On receipt of a clock transition of the clock signal 316 at the clock (CLK) input of the D flip-flop 306, the Q-bar output of the D flip-flop 306 can output a logic 1 signal, which can be received by a first input terminal of an OR logic gate 314 and the D input of a D flip-flop 308. On receipt of another clock transition of the clock signal 316 at the clock (CLK) input of the D flip-flop 308, the Q output of the D flip-flop 308 can output a logic 1 signal, which can be received by a second input terminal of the OR logic gate 314 and the D input of a D flip-flop 310. On receipt of yet another clock transition of the clock signal 316 at the clock (CLK) input of the D flip-flop 310, the Q output of the D flip-flop 310 can output a logic 1 signal, which can be received by a third input terminal of the OR logic gate 314 and the D input of a D flip-flop 312. On receipt of still another clock transition of the clock signal 316 at the clock (CLK) input of the D flip-flop 312, the Q output of the D flip-flop 312 can output a logic 1 signal, which can be received by a fourth input terminal of the OR logic gate 314. It is pointed out that as long as the logic 1 signal is a steady state at the D input of the D flip-flop 306, that logic 1 signal can propagate through the D inputs and Q outputs of D flip-flops 306, 308, 310 and 312. Since the OR gate 314 is receiving at least one logic 1 signal during each clock transition of the clock signal 316, the OR gate 314 can output a continuous logic 1 signal that can be received by the inverter 110 and the enable input 104 of the SPI slave interface 102. As such, the SPI slave interface 102 can be enabled while disabling the I²C slave interface 106.

However, if the received MISO signal 112 and the actual voltage on the MISO pin 126 are determined to be different by the XOR gate 304, it can mean that the MISO pin 126 has been coupled to power or ground since it is not being used. As such, the XOR gate 304 can output a logic 1 signal, which can be received by the D input of the D flip-flop 306. On receipt of a clock transition of the clock signal 316 at the clock input of the D flip-flop 306, the Q-bar output of the D flip-flop 306 can output a logic zero signal, which can be received by the first input terminal of the OR logic gate 314 and the D input of the D flip-flop 308. On receipt of another clock transition of the clock signal 316 at the clock input of the D flip-flop 308, the Q output of the D flip-flop 308 can output a logic zero signal, which can be received by the second input terminal of the OR logic gate 314 and the D input of the D flip-flop 310. On receipt of yet another clock transition of the clock signal 316 at the clock input of the D flip-flop 310, the Q output of the D flip-flop 310 can output a logic zero signal, which can be received by the third input terminal of the OR logic gate 314 and the D input of the D flip-flop 312. On receipt of still another clock transition of the clock signal 316 at the clock input of the D flip-flop 312, the Q output of the D flip-flop 312 can output a logic zero signal, which can be received by the fourth input terminal of the OR logic gate 314. It is pointed out that as long as the logic zero signal is a steady state at the D input of the D flip-flop 306, the logic zero signal can propagate through the D inputs and Q outputs of the D flip-flops 306, 308, 310 and 312. Since the OR gate 314 is receiving four logic zero signals after the fourth clock transition of the clock signal 316, the OR gate 314 can output a logic zero signal that can be received by the inverter 110 and the enable input 104 of the SPI slave interface 102. Therefore, the SPI slave interface 102 can be disabled while enabling the I²C slave interface 106.

Within FIG. 3, it is noted that the continuous detector circuit 300 includes a debounce functionality that can be implemented using the D flip-flops 306, 308, 310 and 312 along with the OR gate 314. As such, the continuous detector circuit 300 may not be affected by any transient output by the XOR gate 304. For example in an embodiment, if the OR gate 314 is outputting a steady state logic 1 signal and then it outputs a blip of a logic zero signal, the continuous detector circuit 300 is not be affected by it. Specifically, since the OR gate 314 is receiving at least one logic 1 signal from the D flip-flops 306, 308, 310 and 312 while the logic zero propagated through them, the OR gate 314 will continue to output a logic 1 signal. It is pointed out that the D flip-flops 306, 308, 310 and 312 of the continuous detector circuit 300 can be coupled in series, as shown.

Note that the continuous detector circuit 300 can be implemented in a wide variety of ways. For example in one embodiment, the continuous detector circuit 300 can be implemented with two D flip-flops (e.g., 306 and 308) coupled in series instead of the four D flip-flops 306, 308, 310 and 312 shown. It is noted that the I/O driver (or line driver) circuit 302 can be implemented in a wide variety of ways. For example, in an embodiment in accordance with the invention, the I/O driver circuit 302 can be implemented as a fairly weak driver circuit capable of driving single digit milliamperes either high or low, but is not limited to such. In accordance with this embodiment, it is pointed out that if the I/O driver circuit 302 is coupled externally to power or ground, there would be some current flow, but it would just be a few milliamperes.

Within FIG. 3, an input terminal of the I/O driver 302 can be coupled to receive the MISO signal 112 that can be output by the SPI slave interface 102. An output terminal of the I/O driver 302 can be coupled to the MISO pin 126 of the integrated circuit 100. Additionally, the output terminal of the I/O driver 302 can be coupled to a first input terminal of the XOR gate 304 while a second input terminal of the XOR gate 304 can be coupled to receive the MISO signal 112 output by the SPI slave interface 102. The D input of the D flip-flop 306 can be coupled to the output of the XOR gate 204. The clock input of each of the D flip-flops 306, 308, 310 and 312 can be coupled to receive the clock signal 316. Also, the Q output of the D flip-flop 306 can be coupled to the first input terminal of the OR gate 314 and to the D input of the D flip-flop 308. The Q output of the D flip-flop 308 can be coupled to the second input terminal of the OR gate 314 and to the D input of the D flip-flop 310. Moreover, the Q output of the D flip-flop 310 can be coupled to the third input terminal of the OR gate 314 and to the D input of the D flip-flop 312. Furthermore, the Q output of the D flip-flop 312 can be coupled to the fourth input terminal of the OR gate 314. The output terminal of the OR gate 314 can be coupled to the enable 104 of the SPI slave interface 102 and also to the inverter 110.

Within FIG. 3, it is understood that the continuous detector 300 may not include all of the elements illustrated by FIG. 3. Additionally, the continuous detector 300 can be implemented to include one or more elements not illustrated by FIG. 3.

FIG. 4A is a block diagram of an exemplary system 400 in accordance with various embodiment of the invention. It is pointed out that the elements of FIG. 4 having the same reference numbers as the elements of any other figure herein can operate or function in any manner similar to that described herein, but are not limited to such. Specifically, the system 400 can be implemented to include a Serial Peripheral Interface (SPI) master device 402 and the integrated circuit 100 that includes the intelligent serial interface 101. It is noted that in one embodiment, when the SPI slave interface circuit 102 of the intelligent serial interface 101 is enabled, the integrated circuit 100 can be coupled to the SPI master device 402 as shown.

Specifically, in an embodiment, the SPI master device 402 can include an input 404 that can be coupled to the data pin 126 of the integrated circuit 100. As such, the SPI master device 402 can use the input 404 for receiving a Master Input/Slave Output (MISO) signal (e.g., 112) from the SPI slave interface circuit 102 of the intelligent serial interface 101. Additionally, the SPI master device 402 can include an output 406 that can be coupled to the data pin 128 of the integrated circuit 100. Therefore, the SPI master device 402 can use the output 406 for transmitting a Slave Select signal (SS-bar) (e.g., 116) to the SPI slave interface circuit 102 of the intelligent serial interface 101. Furthermore, the SPI master device 402 can include an output 408 that can be coupled to the data pin 130 of the integrated circuit 100. As such, the SPI master device 402 can use the output 408 for transmitting a SPI Serial Clock (SCK) signal (e.g., 118) to the SPI slave interface circuit 102. Moreover, the SPI master device 402 can include an output 410 that can be coupled to the data pin 132 of the integrated circuit 100. Therefore, the SPI master device 402 can use the output 410 for transmitting a Master Output/Slave Input (MOSI) signal (e.g., 120) to the SPI slave interface circuit 102.

Within FIG. 4A, it is understood that the system 400 may not include all of the elements illustrated by FIG. 4A. Additionally, the system 400 can be implemented to include one or more elements not illustrated by FIG. 4A.

FIG. 4B is a block diagram of another exemplary system 450 in accordance with various embodiment of the invention. Specifically, the system 450 can be implemented to include an Inter-Integrated Circuit ($I^2C$) communication bus master device 452 and the integrated circuit 100 that includes the intelligent serial interface 101. It is noted that in an embodiment, when the $I^2C$ slave interface circuit 106 of the intelligent serial interface 101 is enabled, the integrated circuit 100 can be coupled to the $I^2C$ master device 452 as shown.

Specifically, in one embodiment, the $I^2C$ master device 452 can include an output 454 that can be coupled to the data pin 130 of the integrated circuit 100. As such, the $I^2C$ master device 452 can use the output 454 for transmitting an $I^2C$ Serial Clock (SCL) signal (e.g., 122) to the $I^2C$ slave interface circuit 106 of the intelligent serial interface 101. Additionally, the $I^2C$ master device 452 can include an input/output 456 that can be coupled to the data pin 128 of the integrated circuit 100. Therefore, the $I^2C$ master device 452 can use the input/output 456 for transmitting and receiving an $I^2C$ Serial Data (SDA) signal 124 with the $I^2C$ slave interface circuit 106 of the intelligent serial interface 101. It is noted that since the $I^2C$ slave interface circuit 106 of the intelligent serial interface 101 does not utilize the pins 126 and 128 of the integrated circuit 100, the pin 126 can be coupled to a voltage source (Vcc) 458 while the pin 128 is not coupled to anything.

Within FIG. 4B, it is understood that the system 450 may not include all of the elements illustrated by FIG. 4B. Furthermore, the system 450 can be implemented to include one or more elements not illustrated by FIG. 4B.

Figure 5:
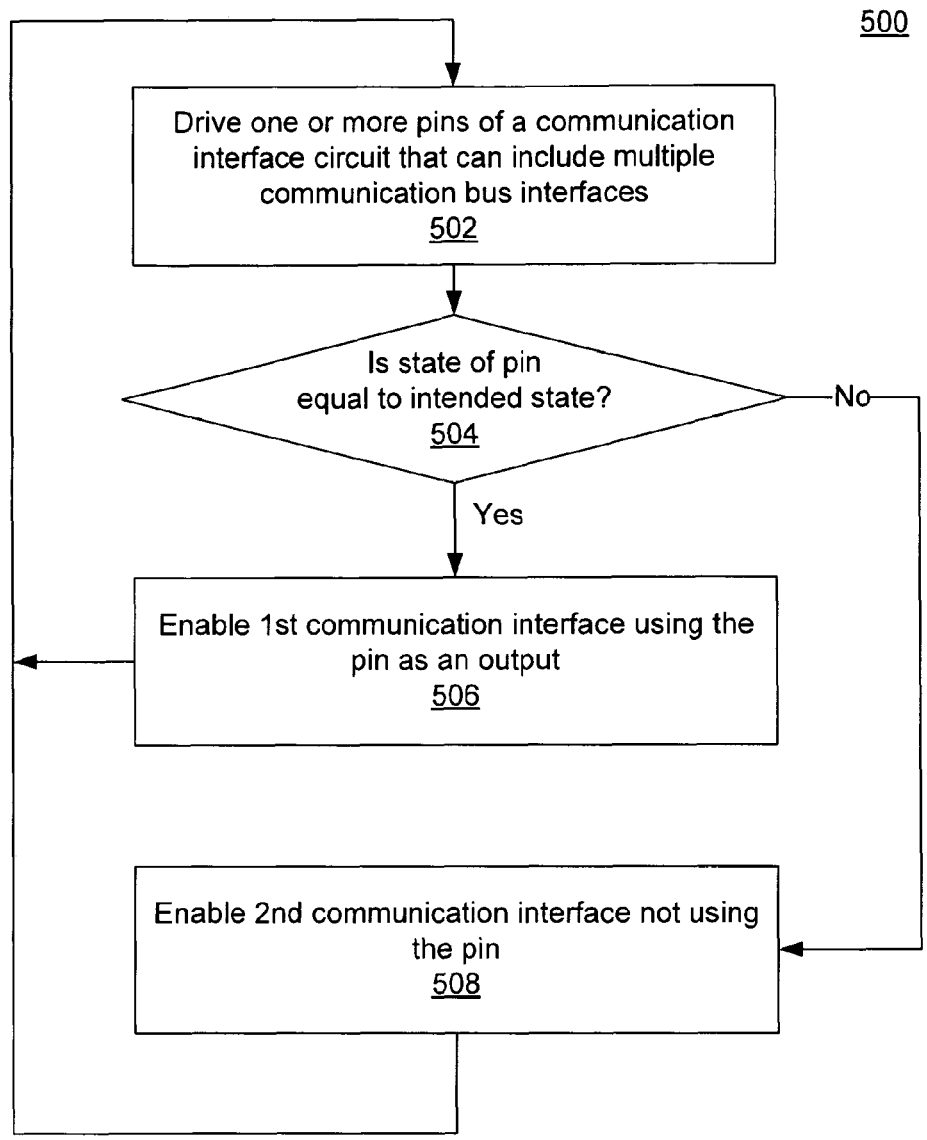
FIG. 5 is a flow diagram of an exemplary method in accordance with various embodiments of the invention.

FIG. 5 is a flow diagram of a method 500 in accordance with various embodiments of the invention for automatically detecting between different communication interfaces. Although specific operations are disclosed in method 500, such operations are exemplary. Method 500 may not include all of the operations illustrated by FIG. 5. Also, method 500 may include various other operations and/or variations of the operations shown by FIG. 5. Likewise, the sequence of the operations of method 500 can be modified. It is noted that the operations of method 500 can be performed by software, by firmware, by electronic hardware, by electrical hardware, or by any combination thereof.

Specifically, method 500 can include driving one or more pins of an integrated circuit that can include multiple communication interfaces. It can be determined whether the state of the one or more pins are equal (or similar) to an intended or predefined state. If so, a first communication interface can be enabled using the one or more pins as an output. However, if the one or more pins are not equal to the intended state, a second communication interface can be enabled which does not use the one or more pins. Note that after either communication interface is enabled, process 500 can return to driving the one or more pins of the integrated circuit. In this manner, automatic detection can be performed between different communication interfaces of the integrated circuit.

At operation 502 of FIG. 5, one or more pins (e.g., 126) can be driven of an integrated circuit (e.g., 100) that can include multiple communication interfaces (e.g., 102 and 106). Note that operation 502 can be implemented in a wide variety of ways. For example, operation 502 can be implemented in any manner similar to that described herein, but is not limited to such.

At operation 504, it can be determined whether a state of the one or more pins are equal (or similar) to an intended or predefined state. If so, process 500 can proceed to operation 506. However, if the one or more pins are not equal (or similar) to the intended state at operation 504, process 500 can proceed to operation 508. It is pointed out that operation 504 can be implemented in a wide variety of ways. For example in an embodiment, a detector circuit (e.g., 114) can automatically determine or detect at operation 504 whether the state (or factor) of the one or more pins are equal to (or similar to) a predefined state or factor. Furthermore, the predefined state or factor at operating 504 can include, but is not limited to, a difference in voltage, a difference in current, a difference in signal, a pin of a communication interface not being used, a pin used as an input for one communication interface (e.g., 106) and used as an output for another communication interface (e.g., 102), a difference in pins used by a communication interface, a coupling of a pin of a first communication interface (e.g., 102) that is not used by a second communication interface (e.g., 106), and the like. Operation 504 can be implemented in any manner similar to that described herein, but is not limited to such.

At operation 506 of FIG. 5, a first communication interface (e.g., 102) can be automatically enabled using the one or more pins as an output. Note that a second communication interface (e.g., 106) can also be automatically disabled at operation 506. It is noted that operation 506 can be implemented in a wide variety of ways. For example, operation 506 can be implemented in any manner similar to that described herein, but is not limited to such. At the completion of operation 506, process 500 can proceed to operation 502.

At operation 508, a second communication interface (e.g., 106) can be automatically enabled, but it does not use the one or more pins. It is noted that the first communication interface (e.g., 102) can also be automatically disabled at operation 508. Note that operation 506 can be implemented in a wide variety of ways. For example, operation 508 can be implemented in any manner similar to that described herein, but is not limited to such. At the completion of operation 508, process 500 can proceed to operation 502.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A method comprising:
    driving an output pin of an integrated circuit that comprises a first communication interface and a second communication interface;
    determining if a state of the output pin is similar to a predefined state;
    if the state of the output pin is similar to the predefined state, automatically enabling the first communication interface and disabling the second communication interface; and
    if the state of the output pin is not similar to the predefined state, automatically enabling the second communication interface and disabling the first communication interface.

2. The method of claim 1, wherein the first communication interface comprises a Serial Peripheral Interface (SPI) bus slave interface.

3. The method of claim 1, wherein the second communication interface comprises an Inter-Integrated Circuit (I$^2$C) bus slave interface.

4. The method of claim 1, wherein the predefined state comprises a voltage level.

* * * * *